US012712548B2

(12) United States Patent
Kumashikar et al.

(10) Patent No.: US 12,712,548 B2
(45) Date of Patent: Aug. 18, 2026

(54) POWER ALLOCATION USING MULTIPLE VOLTAGE DOMAINS FOR PROGRAMMABLE LOGIC DEVICES

(71) Applicant: Altera Corporation, San Jose, CA (US)

(72) Inventors: Mahesh K. Kumashikar, Bangalore (IN); Ankireddy Nalamalpu, Portland, OR (US); Md Altaf Hossain, Portland, OR (US); Atul Maheshwari, Portland, OR (US); Yuet Li, Fremont, CA (US); Mahesh A. Iyer, Fremont, CA (US)

(73) Assignee: Altera Corporation, San Jose, CA (US)

( * ) Notice: Subject to any disclaimer, the term of this patent is extended or adjusted under 35 U.S.C. 154(b) by 389 days.

(21) Appl. No.: 17/559,569

(22) Filed: Dec. 22, 2021

(65) Prior Publication Data

US 2022/0116045 A1 Apr. 14, 2022

(51) Int. Cl.
*H03K 19/17736* (2020.01)
*H03K 19/1776* (2020.01)
*H03K 19/17784* (2020.01)

(52) U.S. Cl.
CPC ... *H03K 19/17736* (2013.01); *H03K 19/1776* (2013.01); *H03K 19/17784* (2013.01)

(58) Field of Classification Search
CPC ......... H03K 19/17736; H03K 19/1776; H03K 19/17784; H03K 19/177; G06F 30/34; G06F 30/39; G06F 30/392; G06F 30/347; G06F 2119/06; H10D 89/10
USPC ........................................................ 716/116
See application file for complete search history.

(56) References Cited

U.S. PATENT DOCUMENTS

2005/0091629 A1* 4/2005 Eisenstadt ........ H03K 19/17736 326/81
2007/0040577 A1* 2/2007 Lewis ............. H03K 19/17784 326/41
2016/0049941 A1* 2/2016 How ................ H03K 19/17728 326/38
2018/0373829 A1* 12/2018 Mendel ............... G06F 30/3312
2019/0041923 A1 2/2019 Atsatt et al.

* cited by examiner

*Primary Examiner* — Paul Dinh
(74) *Attorney, Agent, or Firm* — FLETCHER YODER PC

(57) ABSTRACT

An integrated circuit device that includes programmable logic circuitry that includes a plurality of regions each configured to operate at different voltage levels. The regions may be separated by level shifters that enable communication between the different voltage level regions. The integrated circuitry may also include software that performs voltage aware placement and routing for a user register-transfer level design, and may direct logic to regions according to voltages defined for the regions.

20 Claims, 6 Drawing Sheets

80

ANALYZE TIMING AND POWER FOR EACH SECTOR — 82

DETERMINE TIMING AND POWER MARGINS FOR EACH OF THE SECTORS — 84

DETERMINE A VOLTAGE FOR EACH OF THE SECTORS — 86

ASSIGN CRITICAL LOGIC TO HIGH VOLTAGE SECTORS AND NON-CRITICAL LOGIC TO LOW VOLTAGE SECTORS — 88

POWER ALLOCATION USING MULTIPLE VOLTAGE DOMAINS FOR PROGRAMMABLE LOGIC DEVICES

BACKGROUND

The present disclosure relates generally to integrated circuit devices having programmable logic, such as programmable logic devices. More particularly, the present disclosure relates to electronic power consumption management of the programmable logic devices.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Integrated circuit devices are found in numerous electronic devices. One type of integrated circuit device is a programmable logic device (PLD), which may use programmable logic circuitry to implement numerous possible system logic designs. The programmable logic device may perform a variety of possible operations using various implemented logic designs. Operating the programmable logic device consumes power. It may be desirable to reduce the amount of power that is consumed by the overall programmable logic device. Yet even if reducing the voltage of the programmable logic device might allow one part of a logic design to operate effectively at lower power, doing so could render another part of the logic design inoperable or unsuitable.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
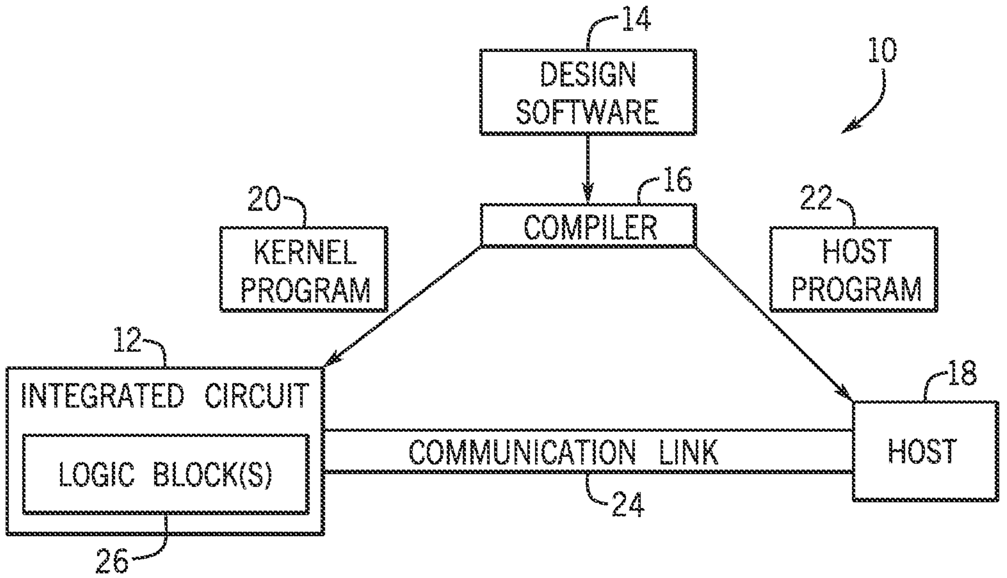
FIG. 1 is a block diagram of a process for programming an integrated circuit including a programmable fabric, in accordance with an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

The present disclosure describes systems and techniques related to electric power consumption of programmable logic devices. In particular, the embodiments described herein are directed to efficient power consumption of a programmable logic device based on providing different voltage levels to sectors of the programmable logic device. For example, the programmable logic device may include different regions of programmable fabric (e.g., programmable logic regions of the FPGA or other programmable logic device) that have separate voltage domains and separate frequency domains. In this manner, the programmable fabric may implement multiple frequency and power domains to enable lower-frequency logic to use a lower power domain than that used for the higher-frequency logic, and thus provide power savings.

The programmable logic device may include programmable logic circuitry divided into sectors (e.g., sectors with independent controllers, sectors with a joint controller) distributed in rows and columns. In some cases, the programmable logic device may be programmed to implement a logic circuit for performing a desired function during operation. The programmable logic device may implement the logic circuit on programmable logic elements of the programmable logic sectors. In some cases, the logic circuit may operate according to a number of operating parameters. In specific cases, the operating parameters of the logic circuit may correspond to an operating voltage of the logic circuit. In one example, a lower operating frequency of the logic circuit may correspond to a lower operating voltage. The programmable logic device may also include software may be used to implement independent control of voltage levels of multiple voltage domains corresponding to multiple sectors in the programmable fabric device.

With that in mind, the programmable logic device may include independent power domains corresponding to each sector or may group multiple sectors into a single power domain. In this way, the programmable logic fabric may implement sector independent voltage control and may also enable coarse granularity by grouping multiple sectors and controlling voltage levels for each group of multiple sectors. The discrete voltage and frequency control for each sector of the programmable logic fabric may be implemented without consuming additional fabric logic resources of the system design. As discussed above, software of the programmable logic fabric may define the voltage levels and frequencies when the design system for the programmable logic fabric is generated. The software of the programmable logic fabric may assign (e.g., optimize) voltages assigned to each sector based on a user-defined register-transfer level (RTL) design and user timing constraints for the RTL design. The software of the programmable fabric may be able to assign non-critical logic to sectors of the programmable logic that have a lower voltage level relative to other sectors and may send instructions to lower the voltage level of one or more sectors based on timing constraints and logic specifications for the user-defined RTL design.

In some cases, the programmable logic device may use level shifters to separate sectors of the programmable logic fabric. In specific cases, the programmable logic device may use the level shifters to provide multiple voltage levels lower than the maximum or default voltage level of the programmable logic device to multiple sectors during operation. Further, isolation circuits may be located within and/or around the level shifters to enable individual sector power control, and the ability of each sector to shut off power independently of other sectors. Accordingly, in such cases, the programmable logic device may draw lower electric power during operation by providing multiple voltage levels to different sectors.

With this in mind, FIG. 1 illustrates a block diagram of a system 10 that may provide different voltage levels to different sectors to reduce power consumption. A designer may desire to implement functionality on an integrated circuit device 12 (such as a field-programmable gate array (FPGA) or an application-specific integrated circuit (ASIC)). In some cases, the designer may specify a high-level program to be implemented, such as an OpenCL program, which may enable the designer to more efficiently and easily provide programming instructions to configure a set of programmable logic cells for the integrated circuit device 12 without specific knowledge of low-level hardware description languages (e.g., Verilog or VHDL). For example, because OpenCL is quite similar to other high-level programming languages, such as C++, designers of programmable logic familiar with such programming languages may have a reduced learning curve than designers that are required to learn unfamiliar low-level hardware description languages to implement new functionalities in the integrated circuit device 12.

The designers may implement their high-level designs using design software 14, such as a version of Intel® Quartus® by INTEL CORPORATION. The design software 14 may use a compiler 16 to convert the high-level program into a lower-level description. The compiler 16 may provide machine-readable instructions representative of the high-level program to a host 18 and the integrated circuit device 12. The host 18 may receive a host program 22 which may be implemented by the kernel programs 20. To implement the host program 22, the host 18 may communicate instructions from the host program 22 to the integrated circuit device 12 via a communications link 24, which may be, for example, direct memory access (DMA) communications or peripheral component interconnect express (PCIe) communications. In some embodiments, the kernel programs 20 and the host 18 may enable configuration of programmable logic 26 on the integrated circuit device 12. The programmable logic 26 may include circuitry to implement, for example, operations to perform matrix-matrix or matrix-vector multiplication for AI or non-AI data processing. The integrated circuit device 12 may include many (e.g., hundreds, thousands, millions of) logic cells that define the programmable logic 26. Additionally, the programmable logic 26 may be communicatively coupled to one another such that data outputted from one portion of the programmable logic 26 may be provided to other portions of the programmable logic 26.

In some embodiments, the designer may use the design software 14 to generate and/or to specify a low-level program, such as the low-level hardware description languages described above. Further, in some embodiments, the system 10 may be implemented without a separate host program 22. Moreover, in some embodiments, the techniques described herein may be implemented in circuitry as a non-programmable circuit design. Thus, embodiments described herein are intended to be illustrative and not limiting.

Further, it should be understood that the integrated circuit 12 may be any other suitable type of integrated circuit device (e.g., an application-specific integrated circuit and/or application-specific standard product). As shown, the integrated circuit 12 may have input/output circuitry for driving signals off device and for receiving signals from other devices via input/output pins. Interconnection resources, such as global and local vertical and horizontal conductive lines and buses, may be used to route signals on integrated circuit 12. Additionally, interconnection resources may include fixed interconnects (conductive lines) and programmable interconnects (e.g., programmable connections between respective fixed interconnects). Programmable logic 26 may include combinational and sequential logic circuitry. For example, programmable logic 26 may include look-up tables, registers, and multiplexers. The programmable logic 26 may include combinatorial or sequential logic circuitry arranged in logic array blocks (LABs) or configurable logic blocks (CLBs). In various embodiments, the programmable logic 26 may be configured to perform a custom logic function. The programmable interconnects associated with interconnection resources may be considered to be a part of the programmable logic 26.

Programmable logic devices (PLDs), such as integrated circuit 12, may contain programmable elements (e.g., logic cells, logic blocks) within the programmable logic 26. For example, as discussed above, a designer (e.g., a customer) may program (e.g., configure) the programmable logic 26 to perform one or more desired functions. By way of example, some programmable logic devices may be programmed by configuring their programmable elements using mask programming arrangements, which is performed during semiconductor manufacturing. Other programmable logic devices are configured after semiconductor fabrication operations have been completed, such as by using electrical programming or laser programming to program their programmable elements. In general, programmable elements may be based on any suitable programmable technology, such as fuses, antifuses, electrically-programmable read-only-memory technology, random-access memory cells, mask-programmed elements, and so forth.

Figure 2:
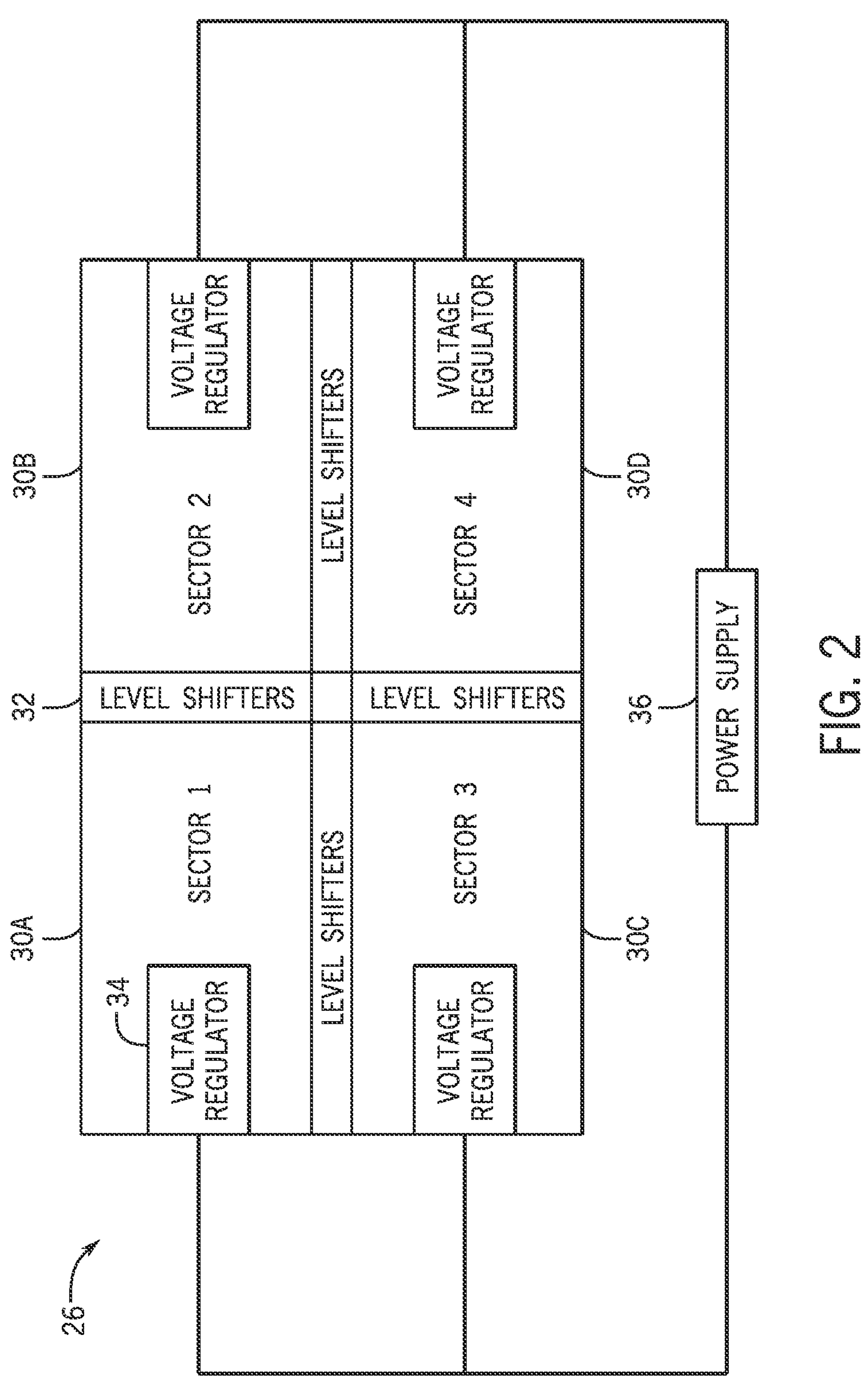
FIG. 2 is a diagram of the programmable fabric of FIG. 1 depicting programmable logic sectors having different power domains connected to a single power supply, in accordance with an embodiment of the present disclosure.

Turning now to a more detailed discussion of the integrated circuit device 12, FIG. 2 is a diagram of the programmable fabric of FIG. 1 depicting programmable logic sectors of the fabric connected to a single power supply. The programmable logic 26 may be divided into sectors 30A, 30B, 30C, 30D. For example, the programmable logic 26 may be divided into a first sector 30A, a second sector 30B, a third sector 30C, and a fourth sector 30D. The sectors 30A, 30B, 30C, 30D of the programmable logic 26 may be separated from one another by horizontally arranged level shifters 32 and vertically arranged level shifters 32. The level shifters 32 may provide a voltage level lower than a maximum or default voltage level of the programmable logic 26 to at least one of the sectors 30A, 30B, 30C, 30D during operation. The level shifters 32 may enable each of the sectors 30A, 30B, 30C, 30D to establish an independent power domain within the programmable logic 26. For example, the level shifters 32 may enable the first sector 30A operating at a first voltage to communicate with the second sector 30B that may be operating at a second voltage higher than the first voltage.

Additionally, each sector 30A, 30B, 30C, 30D may be connected to an independent voltage regulator 34 and a power supply 36. Each sector 30A, 30B, 30C, 30D may run via connections to the same power supply 36. The power supply 36 may provide power control for each of the sectors 30A, 30B, 30C, 30D. The level shifters 32 may be located on all the fabric wires between each of the sectors 30A, 30B, 30C, 30D, and may separate each of the sectors 30A, 30B, 30C, 30D. Further, isolation circuits may be located within and/or around the level shifters 32 to enable individual sector power control, and the ability of each sector 30A, 30B, 30C, 30D to shut off power independently.

Each of the sectors 30A, 30B, 30C, 30D may include sector control circuitry that may receive control signals (e.g., from the programmable logic device software, from a host, or from an overall device controller such as a secure device manager (SDM)). The programmable logic device software may designate voltage levels of the multiple voltage domains corresponding to each sector 30A, 30B, 30C, 30D of the programmable logic 26. Each sector 30A, 30B, 30C, 30D may receive the designated voltage level, and utilize the voltage regulator 34 corresponding to the sector 30A, 30B, 30C, 30D to regulate the voltage level of the sector 30A, 30B, 30C, 30D. The programmable logic fabric software may assign voltage levels based on logic assigned to run on each of the sectors 30A, 30B, 30C, 30D. For example, the programmable logic fabric software may assign a higher voltage to the first sector 30A and lower voltage to the second sector 30B. The programmable logic fabric software may direct critical logic (e.g., high-priority logic, critical paths) to the first sector 30A that is assigned a higher voltage and assign non-critical logic (e.g., low-priority logic, non-critical paths) to the second sector 30B. In this manner, the programmable logic fabric may utilize power per the sectors 30A, 30B, 30C, 30D as desired, rather than setting the entire programmable logic fabric to a high power and unnecessarily expending the power output of the programmable logic 26.

Figure 3:
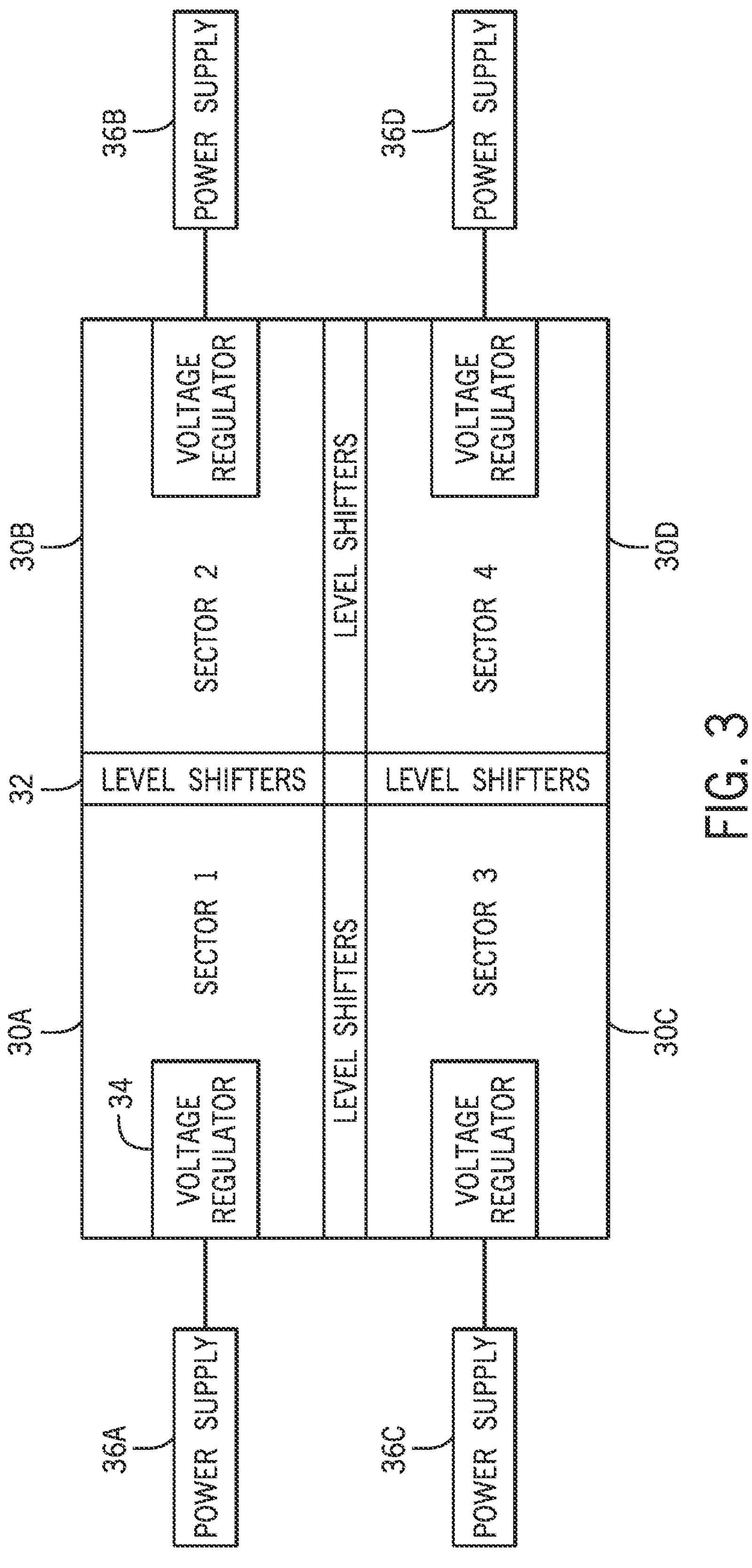
FIG. 3 is a diagram of the programmable fabric of FIG. 1 depicting programmable logic sectors connected to multiple power supplies, in accordance with an embodiment of the present disclosure.

With the foregoing in mind, FIG. 3 a diagram of the programmable fabric of FIG. 1 depicting programmable logic sectors 30A, 30B, 30C, 30D of the programmable fabric connected to multiple power supplies 36. As discussed above, the programmable logic 26 may be divided into sectors 30A, 30B, 30C, 30D to enable independent voltage control of each of the sectors 30A, 30B, 30C, 30D. The sectors 30A, 30B, 30C, 30D may be separated from one another by horizontally arranged level shifters 32 and vertically arranged level shifters 32. The level shifters 32 partition each of the sectors 30A, 30B, 30C, 30D, so that each sector may implement independent voltage control.

Multiple voltage domains corresponding to each of the sectors 30A, 30B, 30C, 30D may be distributed across the programmable logic 26. The programmable logic 26 may then implement control software to control the voltage levels of the multiple voltage domains. Each of the sectors may have an individual power supply 36A, 36B, 36C, 36D that is connected to a voltage regulator 34. Each of the sectors 30A, 30B, 30C, 30D may maintain independent control of their voltage via the power supply corresponding to each of the sectors 30A, 30B, 30C, 30D. The level shifters 32 enable independent voltage domains to be maintained across the sectors 30A, 30B, 30C, 30D. As discussed above, the level shifters 32 may be located on all fabric wires crossing between the sectors. The level shifters 32 may enable the first sector 30A operating at a first voltage to communicate with the second sector 30B that may be operating at a second voltage higher than the first voltage. Further, isolation circuits may be located within and/or around the level shifters 32 to enable individual sector power control, and the ability of each sector 30A, 30B, 30C, 30D to shut off power independently.

Figure 4:
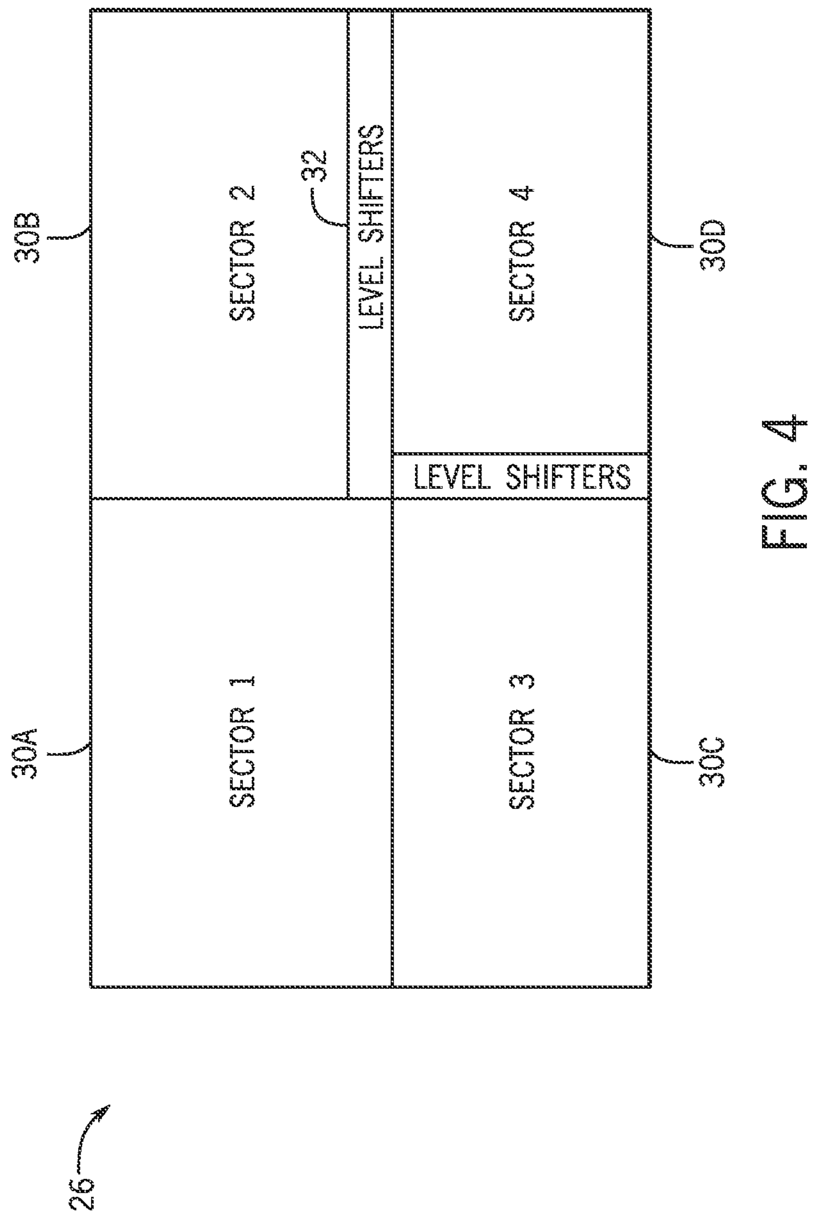
FIG. 4 is a diagram of the programmable fabric of FIG. 1 depicting programmable logic sectors with multi-sector power control, in accordance with an embodiment of the present disclosure.

In some embodiments, multiple groups of sectors may control their voltage independently, as demonstrated in FIG. 4, which is a diagram of the programmable fabric of FIG. 1 depicting programmable logic sectors with multi-sector power control. In some embodiments, the sectors 30A, 30B, 30C, 30D may not include level shifters 32 horizontally and vertically between the sectors 30A, 30B, 30C, 30D. For example, the first sector 30A, the second sector 30B, and third sector 30C may operate at the same voltage, and the voltage for first sector 30A, the second sector 30B, and the third sector 30C may be not use level shifters 32 dividing the sector group due to the same voltage being maintained throughout the sector group. Further, isolation circuits may be located within and/or around the level shifters 32 to enable individual sector power control, and the ability of each sector 30A, 30B, 30C, 30D to shut off power independently.

Group sector voltage control may enable course-grained voltage control. The group of sectors may also receive commands from a host or based on a voltage assignment from the programmable logic control software to deactivate the group of sectors and enable efficient power savings rather than powering off individual sectors of the programmable logic 26.

Figure 5:
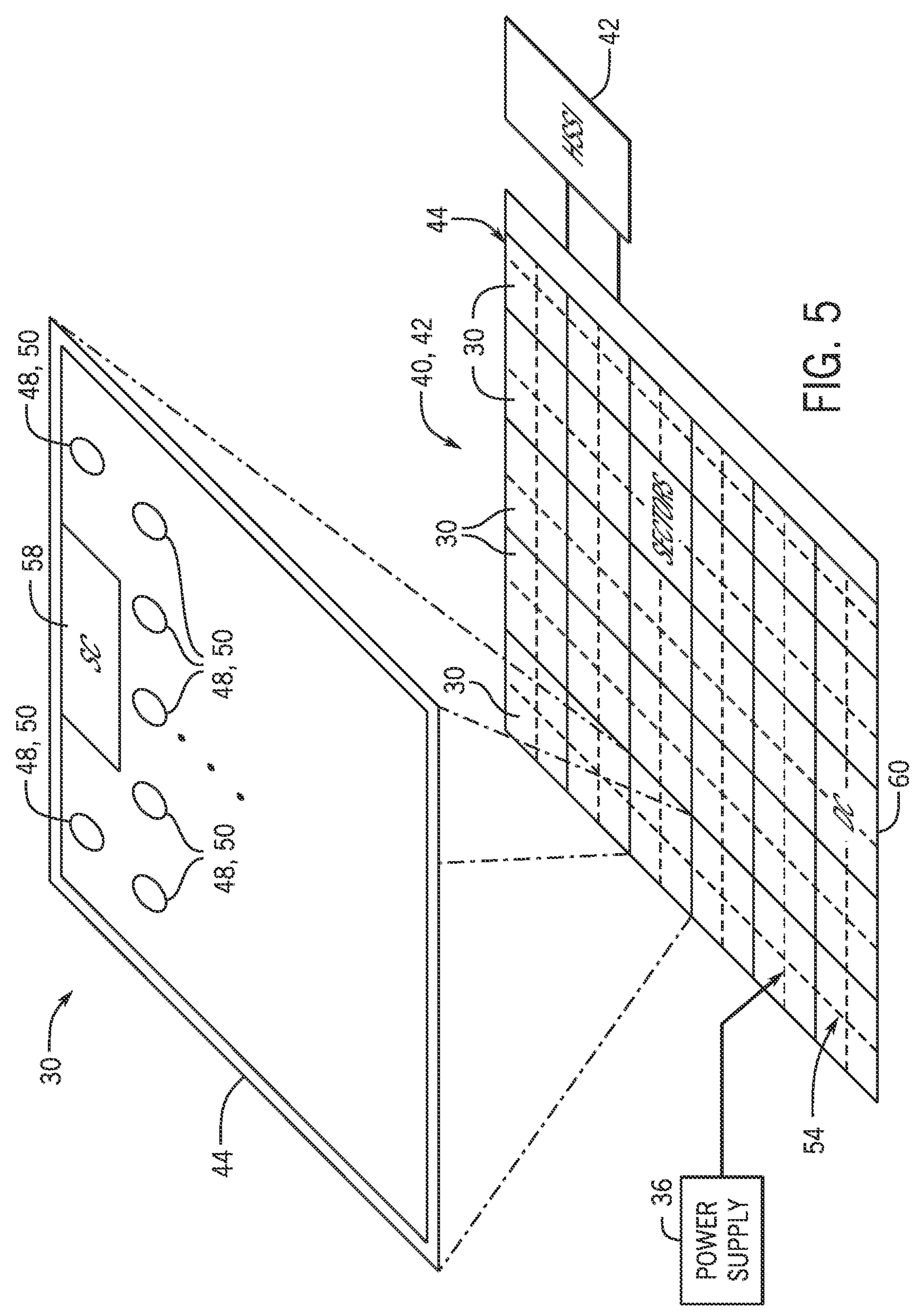
FIG. 5 is a diagram of the programmable fabric of FIG. 1 depicting programmable logic sectors of the programmable fabric, in accordance with an embodiment of the present disclosure.

With the forgoing in mind, FIG. 5 is a diagram depicting the programmable logic sectors 30 on a field programmable gate array (FPGA) 40. An integrated circuit may utilize one or more programmable logic devices (e.g., programmable fabrics, FPGAs). In the example of FIG. 5, the FPGA 40 may include a transceiver 42 that may include and/or use input-output circuitry for driving signals off the FPGA 40 and for receiving signals from other devices. Interconnection resources 44 may be used to route signals, such as clock or data signals, through the FPGA 40.

The FPGA 40 of FIG. 5 is sectorized, meaning that programmable logic resources may be distributed through a number of discrete programmable logic sectors 30. Each programmable logic sector 30 may include a number of programmable logic elements 48 having operations defined by configuration memory 50 (e.g., configuration random access memory (CRAM)).

The programmable logic elements 48 may include (e.g., implement) combinational or sequential logic circuitry. For example, the programmable logic elements 48 may include look-up tables, registers, multiplexers, routing wires, and so forth. A designer may program the programmable logic elements 48 to perform a variety of desired functions. The power supply 36 may provide a source of voltage (e.g., supply voltage) and current to a power distribution network (PDN) 54 that distributes electrical power to the various components of the FPGA 40. Operating the circuitry of the FPGA 40 causes power to be drawn from the power distribution network 54. It should be understood that any suitable number of the power supplies 36 may be implemented.

There may be any suitable number of programmable logic sectors 30 on the FPGA 40. Indeed, while 29 programmable logic sectors 30 are shown here, it should be appreciated that more or fewer may appear in an actual implementation (e.g., in some cases, on the order of 50, 100, 500, 1000, 5000, 10,000, 50,000, or 100,000 sectors or more). Each programmable logic sector 30 may include a sector controller (SC) 58 (e.g., local sector manager (LSM)) that controls the operation of the programmable logic sector 38. Each sector controller 58 may be in communication with a device controller (DC) 60 (e.g., secure device manager (SDM)).

Each sector controller 58 may accept commands and data from the device controller 60 and may read data from and write data into its configuration memory 50 based on control signals from the device controller 60. In addition to these operations, the sector controller 58 may be augmented with numerous additional capabilities. For example, such capabilities may include locally sequencing reads and writes to implement error detection and correction on the configuration memory 50 and sequencing test control signals to effect various test modes.

The sector controllers 58 and the device controller 60 may be implemented as state machines and/or processors. For example, each operation of the sector controllers 218 or the device controller 60 may be implemented as a separate routine in a memory containing a control program. This control program memory may be fixed in a read-only memory (ROM) or stored in a writable memory, such as random-access memory (RAM).

The ROM may have a size larger than would be used to store only one copy of each routine. This may allow each routine to have multiple variants depending on "modes" the local controller may be placed into. When the control program memory is implemented as random access memory (RAM), the RAM may be written with new routines to implement new operations and functionality into the programmable logic sectors 30. This may provide usable extensibility in an efficient and easily understood way. This may be useful because new commands could bring about large amounts of local activity within the sector at the expense of only a small amount of communication between the device controller 60 and the sector controllers 58.

Each sector controller 58 thus may communicate with the device controller 60, which may coordinate the operations of the sector controllers 58 and convey commands initiated from outside the FPGA 40. To support this communication, the interconnection resources 44 may act as a network between the device controller 60 and each sector controller 58. The interconnection resources may support a wide variety of signals between the device controller 60 and each sector controller 58. In one example, these signals may be transmitted as communication packets.

The FPGA 40 may be electrically programmed. With electrical programming arrangements, the programmable logic elements 48 may include one or more logic elements (wires, gates, registers, etc.). For example, during programming, configuration data is loaded into the configuration memory 50 using pins and input/output circuitry. In one example, the configuration memory 50 may be implemented as configuration random-access-memory (CRAM) cells. As discussed below, in some embodiments, the configuration data may be loaded into the FPGA 40 using an update to microcode of the processor in which the FPGA 40 is embedded.

The sector controller 58 of the programmable logic sector 30 is shown to read and write to the configuration memory 50 by providing an ADDRESS signal to an address register and providing a memory write signal (WRITE), a memory read signal (RD DATA), and/or the data to be written (WR DATA) to a data register. These signals may be used to cause the data register to write data to or read data from a line of configuration memory 50 that has been activated along an address line, as provided by the ADDRESS signal applied to the address register. Memory read/write circuitry may be used to write data into the activated configuration memory 50 cells when the data register is writing data and may be used to sense and read data from the activated configuration memory 50 cells when the data register is reading data. The sector controller 58 may receive instructions from a program of the programmable logic fabric to control the voltage of the sector. For example, the sector control may receive instructions from the software program of the programmable logic fabric device to raise the voltage within the sector, and may send a signal to the device controller 60 and/or sector controller to raise the voltage within the sector 30.

Figures 6, 7:
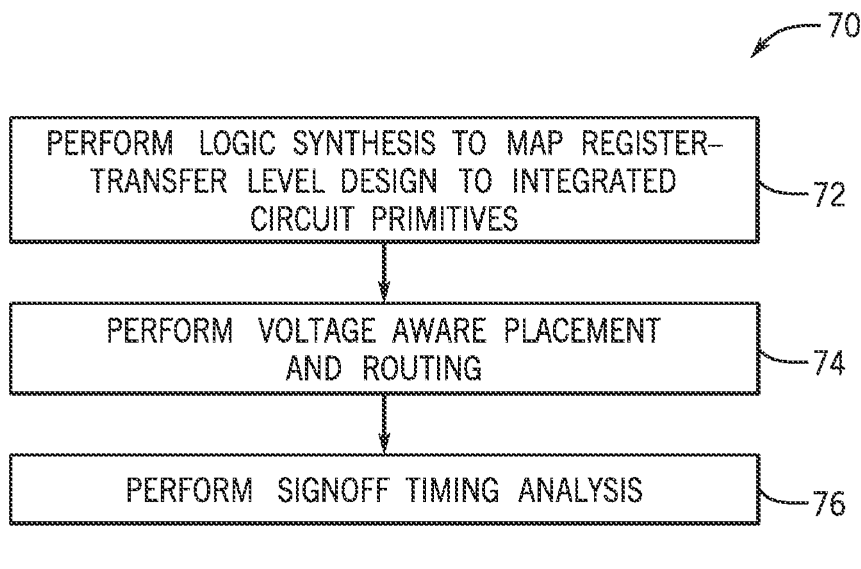
FIG. 6 is a flow diagram of a method of control logic for the programmable logic device of FIG. 1, in accordance with an embodiment of the present disclosure.
FIG. 7 is a flow diagram of a method of control logic for independent power control of sectors of the programmable logic device of FIG. 1, in accordance with an embodiment of the present disclosure.

With the foregoing in mind, FIG. 6 is a flow diagram of a method 70 of control logic for the programmable logic device of FIG. 1, in accordance with an embodiment of the present disclosure. The programmable logic device includes design software 14 that may generate a bitstream that may be saved in the memory 50 and loaded from the memory 50 to be used to program the programmable logic 26 and direct voltage control for each sector 30 of the programmable logic 26.

The design software 14, at block 72, performs logic synthesis to map a register-transfer level (RTL) design for the programmable logic 26 to integrated circuit primitives. This may include optimization of the RTL design to obtain a netlist that includes the RTL designs nodes and connections for analysis. The logic synthesis may include mapping an RTL design and analyzing the RTL design based on user-defined design constraints (e.g., timing constraints, clock frequency desired, power constraints), so that further analysis can be done by the design software 14 to optimize RTL design placement.

The design software 14, at block 74, performs voltage-aware placement and routing for the user submitted RTL design. This may include one or more steps within a fitter operation that optimizes (e.g., improves) the placement and routing of the circuit design for timing, congestion, wiring usage, and memory utilization. It should be understood that although the fitter operation may optimize (e.g., improve) the ultimate placement and routing of the design according to the criteria above, any suitable additional criteria may be considered.

The fitter operation of the design software 14 may implement periphery placement and analytic placement of the RTL design, and may complete physical synthesis of the RTL design in addition to clock allocation to determine timing. The fitter operations may also complete physical clustering and placement legalization of the RTL design. Additionally, the fitter operation may complete detailed placement refinement and an additional physical synthesis to implement the detailed placement refinement. The fitter operation implemented by the design software 14 may also include global routing for the RTL design, clock routing for the RTL design, and detailed routing for the RTL design. The fitter operation may then complete global retiming and again complete physical synthesis of the design. During each optimization within the fitter operation, the fitter operation evolves the critical circuit paths of the initial RTL design, and may assign critical logic to higher-voltage regions (e.g., sectors 30) of the programmable logic 26 that may have 5% to 10% higher voltage than lower-voltage regions. Further, the fitter operation may assign non-critical logic to lower-voltage regions within the programmable logic 26. The timing models used during the clock allocations and clock routing may account for the different voltages that the optimization engines of the fitter may use. The fitter operation may analyze timing and power through the operation and may compute timing and power margins of the specific paths or regions (e.g., sectors 30) within the programmable logic 26 based on user-defined constraints that may be used to determine the exact voltage within the paths or regions, by utilizing regions that do not alter the criticality profile of the design.

The design software 14, at block 76, may complete a signoff timing analysis, and may determine an optimal RTL design path that may be implemented within the user-defined constraints. The design software 14 may implement an RTL design based on the timing constraints defined by the user and may implement the voltage aware placement and/or routing using the methods detailed above in regard to independent voltage control of sectors 30 within the programmable logic 26 of the FPGA device 40.

With the foregoing in mind, FIG. 7 is a flow diagram of a method 80 for independent power control of the programmable logic sectors 30, in accordance with an embodiment of the present disclosure. As discussed above, design software 14 may be used to define the voltage to be used within the sectors 30 of the programmable logic 26.

The design software 14, at block 82, may analyze the timing and power for each of the sectors 30 based on a user-defined RTL design. The power output of each sector may vary based on design constraints and critical logic used in the design. The timing and power may be analyzed based on the fitter optimization discussed above in FIG. 6. The design software 14, at block 84, may determine power and timing margins for each of the sectors 30 within the programmable logic 26. The timing and power margins for each sector 30 may be used by the design software 14, at block 86, to determine the voltage assigned to each sector 26. The design software 14 may define control signals to be provided in a bitstream to the sector controller 58 of each sector 26 to enable voltage control of each sector individually based on timing and power margins determined for each of the sectors 30 within the programmable logic 26.

The design software 14, at block 88, may assign critical logic to sectors 30 of the programmable logic 26 with determined higher voltage sectors 30 relative to the lower voltage sectors 30 that may be assigned non-critical logic. In this way, the design software 14 may assign critical logic based on the determined voltages for each sector 30 to distribute logic for the RTL design efficiently based on determining that certain sectors 30 may include lower voltage relative to the design logic within the other sectors 30. It should be understood that the voltage may be defined independently for one or more sectors 30 within the programmable logic 26, and a timing model may be implemented to determine the lowest voltage that may be as signed to each sector 30 to fulfill the user-defined timing constraints received by the design software 14. In this way, the programmable logic device may implement independent voltage control and optimize logic routing based on user-defined timing constraints for the RDL design.

Technical effects of the present disclosure include multiple voltage domains and multiple frequency domains that may be distributed across the programmable logic fabric of the programmable logic device (e.g., FPGA). The programmable logic device software may be used to control voltage levels within the multiple voltage domains in the programmable fabric. The ability to use lower frequency logic for a lower voltage power domain than used for the higher-frequency logic enables power savings for the programmable logic device. Systems and methods to do so may include voltage-aware placement and routing, that enables the programmable logic device software to optimize routing of logic based on user timing constraints and voltages of the programmable logic 26. These systems and methods may reduce power consumed by the integrated circuit 12. For example, non-critical logic may be routed to lower voltage sectors 30 and/or the voltage of one or more sectors 30 may be lowered based on logic constraints based on the programmable logic software design optimizations.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

EXAMPLE EMBODIMENTS

The following numbered embodiments define certain example embodiments of the present disclosure.

EXAMPLE EMBODIMENT 1. An integrated circuit system comprising:

programmable logic circuitry comprising a plurality of regions configurable to operate at different voltage levels; and a plurality of level shifters configurable to facilitate communication between one region operating at a first voltage and a second region operating at a second voltage.

EXAMPLE EMBODIMENT 2. The integrated circuit of example embodiment 1, wherein each region of the plurality of regions comprises a voltage regulator to control an amount of voltage for each of the regions.

EXAMPLE EMBODIMENT 3. The integrated circuit of example embodiment 1, wherein each region of the plurality of regions receives power from an independent power supply.

EXAMPLE EMBODIMENT 4. The integrated circuit of example embodiment 1, wherein each region of the plurality of regions comprises a local region controller that programs configuration data into the region.

EXAMPLE EMBODIMENT 5. The integrated circuit of example embodiment 1, wherein multiple regions of the plurality of regions are configured to receive a control signal to shut down a voltage of the multiple regions.

EXAMPLE EMBODIMENT 6. The integrated circuit of example embodiment 1, wherein the plurality of level shifters are located on fabric wires that run across the plurality of regions.

EXAMPLE EMBODIMENT 7. The integrated circuit of example embodiment 1, wherein each region of the plurality of regions is configurable to update voltage dynamically while the programmable logic circuitry is operating.

EXAMPLE EMBODIMENT 8. The integrated circuit of example embodiment 1, wherein each region of the plurality of regions has the same size.

EXAMPLE EMBODIMENT 9. A system comprising:

a programmable logic device configurable to operate a first region at a first voltage and a second region at a second voltage;

memory that stores instructions and a processor to implement the instructions, wherein the instructions cause the processor to:

receive a system design for the programmable logic device;

generate a bitstream to program the programmable logic device using voltage-aware placement and routing; and provide the bitstream to the programmable logic device to program the first region and the second region.

EXAMPLE EMBODIMENT 10. The system of example embodiment 9, wherein the voltage-aware placement and routing comprises determining timing constraints for the system design in light of the first voltage and the second voltage.

EXAMPLE EMBODIMENT 11. The system of example embodiment 10, wherein the bitstream comprises instructions to assign the voltage of the first region to be the first voltage based on the timing constraints for the system design.

EXAMPLE EMBODIMENT 12. The system of example embodiment 9, wherein the system design comprises user-defined constraints comprising timing constraints, power constraints, or both that are affected by voltage.

EXAMPLE EMBODIMENT 13. The system of example embodiment 9, wherein the bitstream comprises instructions that correspond to a voltage value for one or more regions of a plurality of regions of the programmable logic device.

EXAMPLE EMBODIMENT 14. A method comprising:

receiving, via a processor, a register-transfer level design comprising user-defined timing constraints;

determining, via the processor, voltage-aware placement and routing based on the timing constraints; and based on determination of voltage-aware placement and routing, assign to a first region of a plurality of regions of programmable logic circuitry a lower voltage than a second region.

EXAMPLE EMBODIMENT 15. The method of example embodiment 14, wherein determining the voltage-aware placement and routing comprises evolving critical paths of the register-transfer level design based on optimization criteria in light of an assignment of different voltage levels to different regions of the plurality of regions of programmable logic circuitry.

EXAMPLE EMBODIMENT 16. The method of example embodiment 15, wherein the optimization criteria comprises timing, congestion, wiring usage, and utilization in light of the different voltage levels.

EXAMPLE EMBODIMENT 17. The method of example embodiment 14, wherein the voltage-aware placement and routing comprises determining voltage levels to assign to the plurality of regions of the programmable logic fabric.

EXAMPLE EMBODIMENT 18. The method of example embodiment 14, wherein the second region comprises at least one critical path of the register-transfer level design and the first region comprises not one critical path of the register-transfer level design.

EXAMPLE EMBODIMENT 19. The method of example embodiment 14, wherein the method comprises sending control signals defining one or more configuration bits based on the voltage-aware placement and routing in a bitstream.

EXAMPLE EMBODIMENT 20. The method of example embodiment 19, wherein sending the control signals comprises sending the bitstream comprising the one or more configuration bits to configuration random access memory (CRAM) in the plurality of regions of the programmable logic circuitry to define a voltage level of one or more regions of the plurality of regions of the programmable logic circuitry based on the voltage-aware placement and routing.

What is claimed is:

1. An integrated circuit system comprising:

programmable logic circuitry comprising:

a first region of a plurality of regions comprising a first portion of routing resources of the programmable logic circuitry and configurable to operate at a first voltage;

a second region of the plurality of regions comprising a second portion of the routing resources of the programmable logic circuitry and configurable to operate at a second voltage, and wherein the second voltage is higher than the first voltage, and wherein the programmable logic circuitry is programmed using voltage-aware placement and routing that assigns a critical path to the second region; and a plurality of level shifters configurable to enable independent voltage domains between the first region operating at the first voltage and the second region operating at the second voltage.

2. The integrated circuit of claim 1, wherein each region of the plurality of regions comprises a voltage regulator to control an amount of voltage for each of the regions.

3. The integrated circuit of claim 1, wherein each region of the plurality of regions receives power from an independent power supply.

4. The integrated circuit of claim 1, wherein each region of the plurality of regions comprises a local region controller that programs configuration data into the region.

5. The integrated circuit of claim 1, wherein multiple regions of the plurality of regions are configured to receive a control signal to shut down a voltage of the multiple regions.

6. The integrated circuit of claim 1, wherein the plurality of level shifters are located on fabric wires that run across the plurality of regions.

7. The integrated circuit of claim 1, wherein each region of the plurality of regions is configurable to update voltage dynamically while the programmable logic circuitry is operating.

8. The integrated circuit of claim 1, wherein each region of the plurality of regions has the same size.

9. A system comprising:

a programmable logic device configurable to operate:

a first region at a first voltage, wherein the first region comprises a first portion of routing resources of programmable logic circuitry of the programmable logic device; and a second region at a second voltage higher than the first voltage, wherein the second region comprises a second portion of the routing resources of the programmable logic circuitry of the programmable logic device; and memory that stores instructions and a processor to implement the instructions, wherein the instructions cause the processor to:

receive a system design for the programmable logic device;

generate a bitstream to program the programmable logic device using voltage-aware placement and routing that assigns a critical path to the second region; and provide the bitstream to the programmable logic device to program the first region and the second region.

10. The system of claim 9, wherein the voltage-aware placement and routing comprises determining timing constraints for the system design in light of the first voltage and the second voltage.

11. The system of claim 10, wherein the bitstream comprises instructions to assign the voltage of the first region to be the first voltage based on the timing constraints for the system design.

12. The system of claim 9, wherein the system design comprises user-defined constraints comprising timing constraints, power constraints, or both that are affected by voltage.

13. The system of claim 9, wherein the bitstream comprises instructions that correspond to a voltage value for one or more regions of a plurality of regions of the programmable logic device.

14. A method comprising:

receiving, via a processor, a register-transfer level design comprising user-defined timing constraints;

determining, via the processor, voltage-aware placement and routing based on the timing constraints; and based on the determination of the voltage-aware placement and routing:

assigning to a first region of a plurality of regions of programmable logic circuitry, wherein the first region comprises a first portion of interconnection resources of the programmable logic circuitry, a lower voltage than a second region of the plurality of regions of programmable logic circuitry, wherein the second region comprises a second portion of the interconnection resources of the programmable logic circuitry; and generating a bit-stream to program the programmable logic circuitry using the voltage-aware placement and routing that assigns a critical path to the second region.

15. The method of claim 14, wherein determining the voltage-aware placement and routing comprises evolving critical paths of the register-transfer level design based on optimization criteria in light of an assignment of different voltage levels to different regions of the plurality of regions of programmable logic circuitry.

16. The method of claim 15, wherein the optimization criteria comprises timing, congestion, wiring usage, and utilization in light of the different voltage levels.

17. The method of claim 14, wherein the voltage-aware placement and routing comprises determining voltage levels to assign to the plurality of regions of the programmable logic circuitry.

18. The method of claim 14, wherein the first region comprises not one critical path of the register-transfer level design.

19. The method of claim 14, wherein the method comprises sending control signals defining one or more configuration bits based on the voltage-aware placement and routing in a bitstream.

20. The method of claim 19, wherein sending the control signals comprises sending the bitstream comprising the one or more configuration bits to configuration random access memory (CRAM) in the plurality of regions of the programmable logic circuitry to define a voltage level of one or more regions of the plurality of regions of the programmable logic circuitry based on the voltage-aware placement and routing.

* * * * *